United States Patent [19]
Yanagida

[11] Patent Number: 5,866,475
[45] Date of Patent: Feb. 2, 1999

[54] METHOD OF FORMING SOLDER BUMPS

[75] Inventor: Toshiharu Yanagida, Kanagawa, Japan

[73] Assignee: Sony Corporation, Tokyo, Japan

[21] Appl. No.: 851,852

[22] Filed: May 6, 1997

[30] Foreign Application Priority Data

May 8, 1996 [JP] Japan .................................. 8-113518

[51] Int. Cl.⁶ .................................................. H01L 21/44
[52] U.S. Cl. ......................... 438/613; 438/106; 438/118; 438/126; 438/615
[58] Field of Search .................................. 438/613, 615, 438/118, 106, 126, 23

[56] References Cited

U.S. PATENT DOCUMENTS

| | | | |
|---|---|---|---|
| 4,948,754 | 8/1990 | Kondo et al. | 438/613 |
| 5,034,345 | 7/1991 | Shirahata | 438/613 |
| 5,137,845 | 8/1992 | Lochon et al. | 438/614 |
| 5,273,938 | 12/1993 | Lin et al. | 438/118 |
| 5,393,697 | 2/1995 | Chang et al. | 438/613 |
| 5,516,704 | 5/1996 | Yoshida | 438/118 |
| 5,587,336 | 12/1996 | Wang et al. | 438/17 |

*Primary Examiner*—Kevin M. Picardat
*Assistant Examiner*—Deven Collins
*Attorney, Agent, or Firm*—Hill & Simpson

[57] ABSTRACT

An Al electrode pad and a photoresist pattern having an opening portion on the Al electrode pad on a semiconductor substrate on which a surface protective film has been formed are formed. Then, a barrier metal layer is formed on the whole substrate surface, and a resist film and the barrier metal layer on the resist film are removed by lift-off, thus forming a solder bump foundation layer. Furthermore, an adhesive tape is stuck to the substrate surface and then the adhesive tape is peeled off, thereby to perform a residue removing process for removing resist film residues and useless barrier metal residues other than the solder bump foundation layer. With this, it is possible to further remove residues that have remained on the substrate surface without being lifted off and caused a defective device with an adhesive tape, thus making it possible to form a solder bump of high reliability in flip chip bonding. In this way, there is provided a method of forming such a solder bump that is capable of flip chip bonding on a semiconductor device with high reliability.

20 Claims, 5 Drawing Sheets

METHOD OF FORMING SOLDER BUMPS

BACKGROUND OF THE INVENTION

1. Field of the Invention

The present invention relates to a method of forming solder bumps for packaging a semiconductor device on a mounting substrate, and more particularly to a method of forming solder bumps improved so that a semiconductor device may be packaged on a mounting substrate with high reliability.

2. Description of Related Art

In order to increase packaging density of a semiconductor device thereby to further miniaturize an electronic equipment, flip chip bonding in which a semiconductor device is mounted directly on a mounting substrate such as a printed wiring board and electrodes of the semiconductor device and the printed wiring board are bonded together is being conducted widely.

A solder bump method is one of the methods of flip chip bonding, in which, as shown in FIG. 6, a semiconductor device and a printed wiring board are connected electrically with each other by forming solder ball bumps 22 on Al electrode pads 12 and joining solder ball bumps 22 to electrodes (not shown) of a printed wiring board.

Further, a barrier metal 29 lies between an Al electrode pad 12 of the semiconductor device and the ball bump 22 for the purpose of improvement of adhesion and preventing mutual diffusion. Because of the reason that this barrier metal affects a finished configuration of the solder ball bump, it is called a Ball Limiting Metal (BLM) film. The solder ball bumps form a solder film on the BLM film after the BLM film is formed. The solder film is further treated with heat, and is formed into a predetermined configuration on the BLM film by surface tension of the molten solder.

An example of a method of forming a solder bump will be explained hereinafter with reference to FIG. 7. FIGS. 7A to 7E are sectional views of the substrate in respective processes in executing the solder ball bump method, respectively.

In order to form a solder bump, first, as shown in FIG. 7A, an electrode pad 12 composed of an Al alloy or the like is formed on a silicon substrate 10 by a sputtering method, and then a surface protective layer 11 composed of an insulating film such as a polyimide film and a silicon nitride film is coated on the substrate 10. Then, an opening is formed in the surface protective layer 11, thereby to form a connecting hole for exposing the electrode pad 12, and a BLM film 14 composed of a barrier metal layer is formed with patterning on the electrode pad 12 thereafter.

Next, a resist film 18 is formed on the substrate as shown in FIG. 7B, and is applied with patterning further so as to form an opening portion 16 where the BLM film 14 is exposed.

Next, as shown in FIG. 7C, a solder film 20 is formed on the substrate by vapor deposition or the like. In succession, the resist film 18 is removed by resist peeling and cleaning, and the solder film 20 on the resist film 18 is lifted off at the same time. As a result, the solder film 20 remains behind only in the opening portion 16 (FIG. 7B) as shown in FIG. 7D.

Next, the solder film 20 is dissolved by heat treatment, and the solder film 20 located on the BLM film 14 is transformed into ball-shaped solder, thus forming a solder ball bump 22 as shown in FIG. 7E.

Now, high integration and refinement of a semiconductor device are advanced, and a distance (pitch) between adjacent electrode pads is all the more reduced with the above. On the other hand, it is difficult to make the bump diameter smaller than a certain dimension from a viewpoint of security of reliability of junction strength with a mounting substrate such as a printed wiring board for packaging a semiconductor device.

Therefore, as shown in FIG. 8, in order to avoid mutual contact between adjacent bump 23A and bump 23B, it is being tried that an area for forming a solder bump is secured in a wide area different from the electrode pad, an electrode extension portion 27 having a connecting portion 24 for connecting with an electrode pad at one end, a solder bump foundation portion 25 at another end, and a wiring portion 26 for connecting the connecting portion with the solder bump foundation portion is formed of a barrier metal, and then solder bumps are formed at the solder bump foundation portion.

FIGS. 1A to 1D are sectional views of a substrate at a view I—I portion of FIG. 8 in respective processes when the electrode extension portion is formed.

First, a surface protective film 34 composed of polyimide or silicon nitride film or the like is formed on the semiconductor substrate 32 on which an Al electrode pad 30 is formed, next an Al electrode pad 30 is exposed and a long and narrow connecting hole 36 having the same configuration as that of the electrode extension portion 27 shown in FIG. 8 is formed. Then, a photoresist film 40 is formed on the whole surface of the substrate, and furthermore, patterning by exposure and development is performed, and an opening portion 38 communicating with the connecting hole 36 is opened (see FIG. 1A).

Next, the substrate where the opening portion 38 has been formed is set to a high-frequency plasma processing equipment, sputter-etching (reverse sputtering) with plasma is applied to a photoresist film 40, ions are made to collide with the surface of the photoresist film 40 so as to produce transformation by thermal expansion, and, as shown in Fig. 1B, an overhang shape in which a bore at an opening edge 42 of the opening portion 38 is reduced smaller than the bottom portion of the opening portion 38.

Furthermore, barrier metal layers 46 and 48 that are metal multilayer films composed of Cr, Cu and Au are formed on the substrate. As a result, as shown in Fig. 1C, barrier metal layers 46 and 48 are formed on the exposed Al electrode pad 30 and the photoresist film 40, respectively, but no barrier metal layer is formed on a hole wall face 42 of the opening portion 38 because of the transformation in an overhang shape.

Then, when the substrate is soaked in resist peeling liquid and heating oscillation processing is performed, the photoresist film 40 is removed, and the barrier metal layer 48 which has been formed on the photoresist film 40 is also removed by lift-off at the same time. As a result, as shown in Fig. 1D, the electrode extension portion 46 composed of a barrier metal layer connected to the Al electrode pad 30 is formed.

In the above-mentioned conventional method of forming a solder bump, however, it has been difficult to form a pattern of an electrode extension portion in a predetermined shape by the BLM film and to form a solder ball bump in a predetermined shape on the solder bump foundation portion with high yield.

Thus, it has been difficult to improve the reliability of flip chip bonding when a semiconductor device is packaged, and to improve the product yield of the packaged components.

In the light of such circumstances as described above, it is an object of the present invention to present a method of forming a solder bump capable of flip chip bonding on a semiconductor device with high reliability.

The present inventor has found that the above-mentioned problems generated when a solder bump is formed by a conventional method are caused as described hereunder.

The causes are that lift-off of a resist film and a BLM film is incomplete when the BLM film is lifted off together with the resist film, and residues in no small quantities remain on the substrate surface. In a method of forming a solder bump explained with reference to FIG. 7, a simple circular connecting hole is opened on an Al electrode pad. Whereas, when an electrode extension portion is formed as shown in FIG. 8, a shape including a straight line portion and a curved line portion in which a wiring portion in a straight line form is connected to a circular area of a solder bump foundation portion and an electrode pad is presented. This complicated pattern configuration causes poor lift-off of the resist film and the BLM film.

Namely, when the connecting hole is transformed into an overhang form by sputter-etching as the preprocessing of film formation of the BLM, it is difficult to transform the photoresist opening edge corresponding to the electrode extension portion into a moderate overhang shape over the long whole length being different from a case of a simple circle, thus a BLM film is also formed in a pattern sidewall portion where transformation of the opening edge is insufficient. Therefore, the resist peeling liquid can no longer sufficiently penetrate inside, thus making removal of the resist film insufficient. As a result, as shown in Fig. lE, a large quantity of lift-off residues such as a BLM film are generated.

Thus, the present inventor has found as the result of eager study that the residues described above are removable with an adhesive tape, and come to complete the present invention.

SUMMARY OF THE INVENTION

In order to solve the above-mentioned subjects, a method of forming a solder bump according to the present invention comprises, when an electrode extension portion composed of barrier metal having a connecting portion for connecting with an electrode pad at one end, a solder bump foundation portion at another end, and a wiring portion for connecting the connecting portion and the solder bump foundation portion with each other is formed, and then a solder bump is formed in the solder bump foundation portion:

an opening process of forming a resist film on a substrate on which an electrode pad and a surface protective film are formed successively, and then patterning the resist film by a photolithography method, thereby to open a connecting hole in a predetermined pattern;

a process of forming an extension portion for forming a barrier metal layer on a substrate on which the connecting hole is opened, and furthermore removing the barrier metal layer on the resist film together with the resist film by lifting it off by peeling off and cleaning of the resist, thus forming an electrode extension portion composed of a barrier metal layer in the connecting hole; and a residue removing process for removing residues from the substrate surface by sticking an adhesive tape onto the substrate surface that has gone through the extension portion forming process so as to have residues on the substrate surface adhere to the adhesive tape, and then peeling the adhesive tape off the substrate surface together with the residues.

By sticking an adhesive tape over the whole surface of the substrate and then peeling it off, residues of the resist film and residues of barrier metal remaining on the substrate surface without being removed completely are removed by lift-off processing using resist peeling-off liquid. Therefore, these residues are reduced by a large quantity, and as a result, it is possible to form a solder ball bump into a predetermined configuration, and to improve poor flip chip bonding by a large margin. Besides, it is recommended to use a roller for sticking or peeling-off of an adhesive tape.

Further, there is provided preferably a reverse sputtering process for applying reverse sputtering processing to the resist film following to the connecting hole opening process so as to transform the opening into an overhang shape in which the bore of the opening edge of the connecting hole is reduced as compared with the bottom portion of the connecting hole.

With this, when a barrier metal layer is formed, no barrier metal layer is formed on the hole wall surface transformed into an overhang shape. Therefore, since the resist peeling-off liquid penetrates from the hole wall surface when the resist film is removed, the resist film is removed surely. The barrier metal layer laminated on the resist film surface is also removed surely together with the removed resist film.

Further, it is desirable to provide a cleaning process for cleaning the substrate surface with organic solvent after the residue removing process.

With this, it is possible to dissolve and remove residues remaining even after the residue removing process and a part of a gluing agent of an adhesive tape which has remained after adhering onto the substrate. As a result, the residues on the substrate surface are removed completely, thus making it possible to form a solder bump having higher connection reliability.

In the cleaning process, it is desirable to spray an organic solvent using a spray or a jet nozzle while rotating the substrate. It is still more desirable that the resist peeling-off liquid has been adjusted in temperature by heating for instance.

With this, it is possible to remove and to remove by dissolving the residues by applying physical forces such as impact force by spraying a solvent and centrifugal force to the residues.

In a product in which a semiconductor device on which a solder bump is formed by the method of the present invention is packaged on a printed wiring board or the like with a flip chip, the reliability and the durability are improved largely as compared with the past. The method of the present invention is optimum particularly for forming solder bumps on a semiconductor device designed with a minute design rule and of which a high integration level, high performance and high reliability are required.

DESCRIPTION OF THE PREFERRED EMBODIMENTS

Embodiments will be given hereinafter and the embodiments of the present invention will be described in more detail with reference to the accompanying drawings.

Embodiment 1

The present embodiment shows an example of forming a solder bump on a semiconductor device by applying a method of forming a solder bump according to the present invention.

In the present embodiment, first, respective processes shown in FIG. 1 are executed, then a residue removing process by an adhesive tape is executed, and furthermore, a solder bump is formed in the solder bump foundation portion of the electrode extension portion in accordance with the process shown in FIG. 7.

Figure 2:
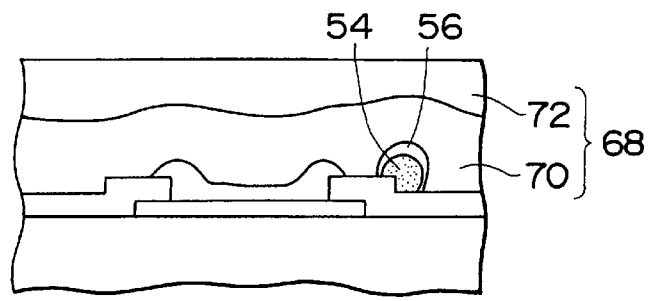
FIG. 2 is a sectional view of a substrate showing peeling-off of residues by an adhesive tape in an embodiment 1.
Figure 3A:
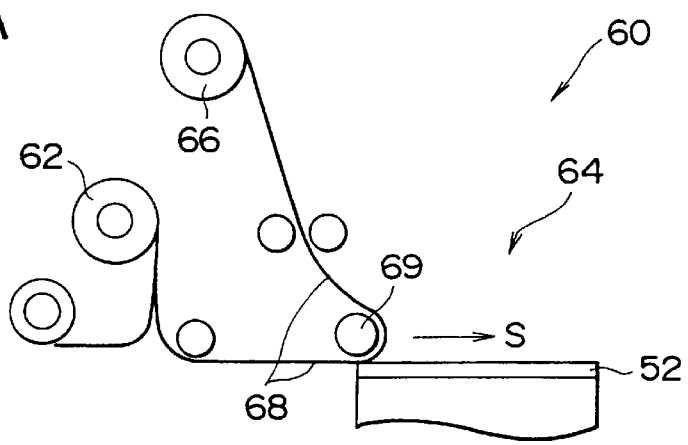
FIGS. 3A to 3C are typical views showing the states that an adhesive tape is stuck to a substrate using rollers and then the adhesive tape is peeled off, respectively.
Figure 3B:
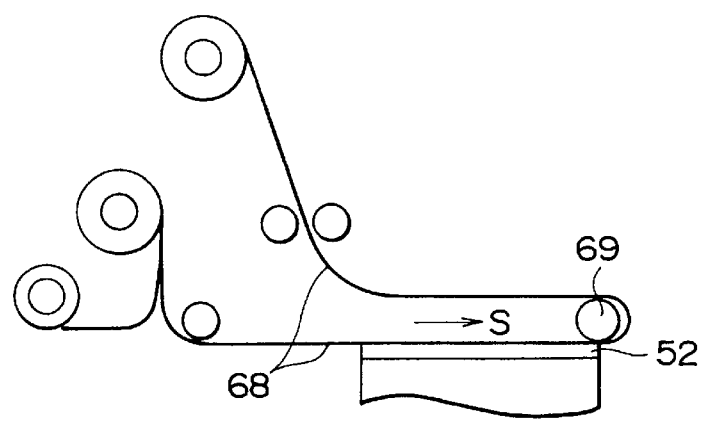

FIG. 2 is a sectional view of a substrate in a state that an adhesive tape is stuck to the substrate, and FIGS. 3A and 3B are typical views showing the states of an adhesive tape and a substrate on each step when the residue removing process by the adhesive tape is executed, respectively.

In the embodiment 1, a residue removing apparatus 60 by an adhesive tape such as shown in FIG. 3 is used. The residue removing apparatus 60 is constituted of a roll tape 62 in which an adhesive tape is wound, a substrate surface processing portion 64, a take-up roller 66 and an adhesive tape 68. The adhesive tape 68 is pulled out of the roll tape 62 and comes in one line over the substrate surface processing portion 64 and further the take-up roller 66, and the tape width is wider than the width of the substrate. A mobile roller 69 is provided in the substrate surface processing portion 64.

The adhesive tape 68 is one type of laminated tape, and is composed of an adhesive layer 70 and laminated sheet 72 as shown in FIG. 2.

It is preferable to use a polyester film as a material of the laminated sheet 72 and an acrylic gluing agent as a material of the adhesive layer 70 in consideration of dissolving ablity of gluing agent residues into organic solvent and therefore to use a tape whose adhesion is higher than that of a normal tape, that is, 450 gf or so.

In the processing apparatus 60, the laminated sheet 72 of the adhesive tape 68 comes into contact with the mobile roller 69, and the adhesive layer 70 is located on the lower side and the laminated sheet 72 is located on the upper side in the adhesive tape located under the mobile roller 69.

Figure 1A:
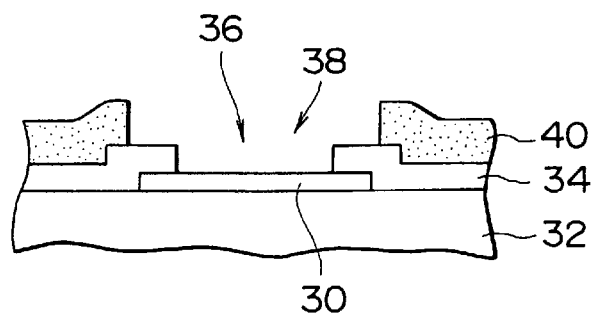
FIGS. 1A to 1E are sectional views of a substrate in respective processes.
Figure 1B:
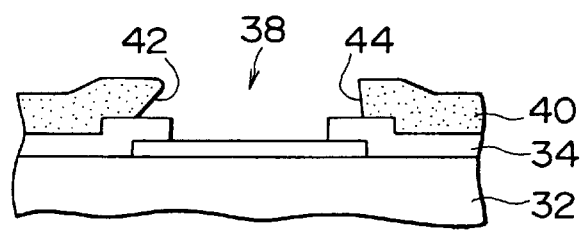
Figure 1C:
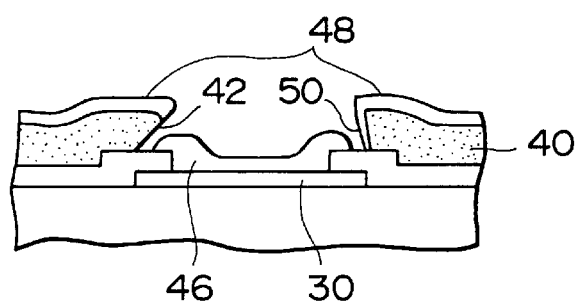
Figure 1D:
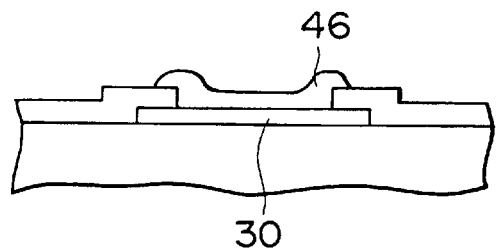
Figure 1E:
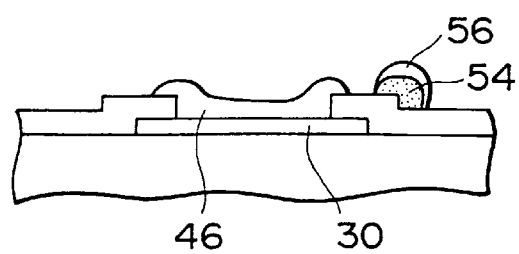

After the process shown in FIG. 1C is completed, as shown in FIG. 3A, a substrate 52 has been arranged so that the end surface of the substrate 52 is located right under the mobile roller 69 and the substrate surface is positioned on the moving direction S side of the mobile roller, and moreover, so that the adhesive layer of the adhesive tape 68 comes into contact with the substrate surface.

Then, as shown in FIG. 3B, the mobile roller 69 was moved in a direction S while pushing out the adhesive tape 68 and while pressing the adhesive tape 68 against the surface of the substrate 52.

As a result, as shown in FIG. 2, the adhesive layer 70 stuck fast to the substrate surface, and furthermore stuck fast also to resist film residue 54 and barrier metal residue 56 on the substrate surface.

Figure 3C:
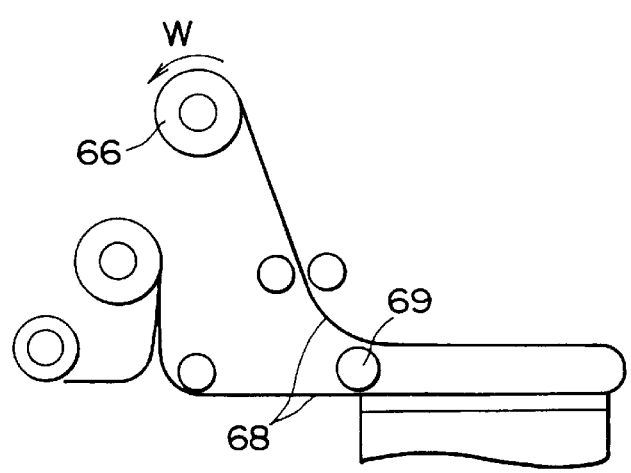
Figure 6:
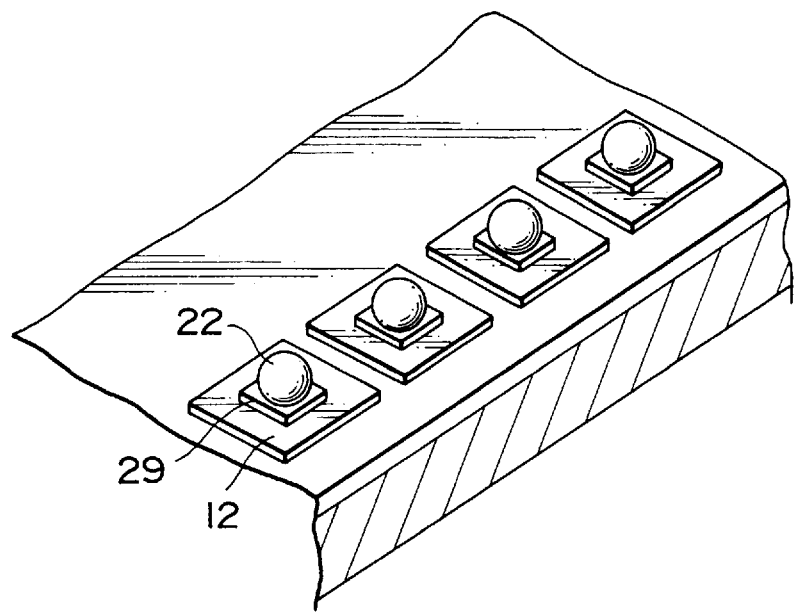
FIG. 6 is a perspective view of a substrate showing conventional solder bumps.
Figure 8:
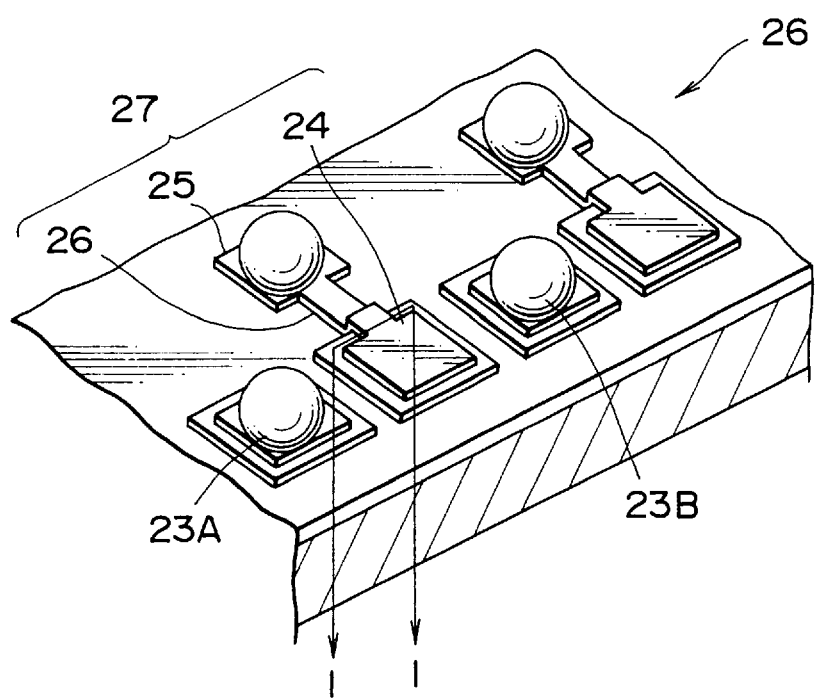
FIG. 8 is a perspective view of a substrate on which a solder bump has been formed in a solder bump foundation portion of an electrode extension portion.
Figure 7A:
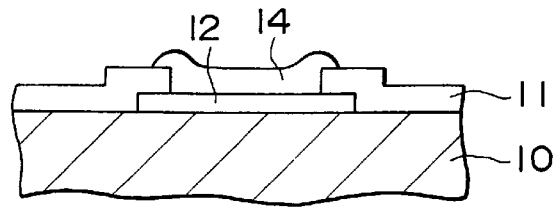
FIGS. 7A to 7E are sectional views of a substrate in respective processes showing a conventional method of forming electrodes for forming solder bumps, respectively.
Figure 7B:
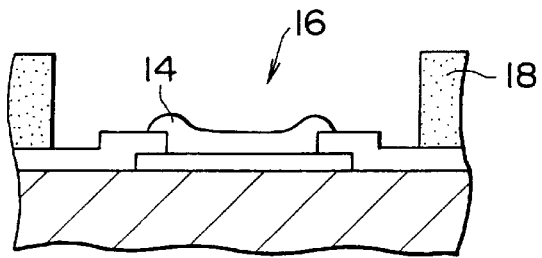
Figure 7C:
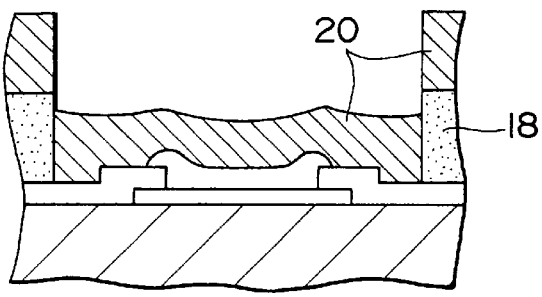
Figure 7D:
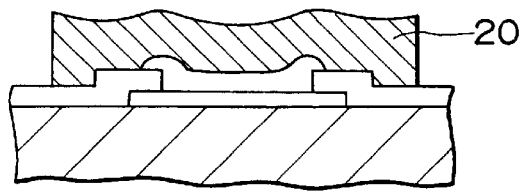
Figure 7E:
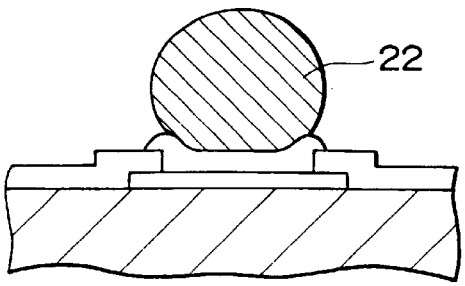

Then, the mobile roller 69 was returned to an original position before movement (FIG. 3C).

Then, the take-up roller 66 was rotated in a direction W, thereby to strip the adhesive tape 68 off the substrate surface. As a result, the resist film residue 54 and the barrier metal residue 56 are removed together with the adhesive tape and the quantity of residues on the substrate surface has been reduced by a large margin as the result.

Then, a solder ball bump has been formed as before as shown in FIG. 7. Besides, a high melting point solder (having a composition ratio of Pb at 97% and Sn at 3%) for forming the solder film. In the present embodiment, since the electrode extension portion is formed simultaneously with the formation of the BLM film and a new process needs not to be added, the process gets off almost without increasing the production cost. Further, the resist peeling-off liquid used in the resist removing process was a mixed liquid of dimethyl sulfoxide $(CH_3)_2SO$ and N-methyl-2-pyrrolidone $(CH_3NC_4H_6O)$.

It has been confirmed that the reliability and the durability have been improved by a large margin as compared with the past in a product that a semiconductor device on which solder bumps have been formed by the method described in the embodiment 1 is packaged on a printed wiring substrate with a flip chip.

Embodiment 2

The embodiment 2 is the same as the embodiment 1 except that a resist peeling-off and cleaning process and a residue cleaning process are executed further after the residue removing process executed in the embodiment 1. Therefore, description of the same processes will be omitted.

Although the quantity of residues on the substrate has been reduced by a large margin by the residue removing process executed in the embodiment 1, a photoresist film burnt together on the substrate surface by thermal decomposition and adhesives from the adhesive layer 70 have adhered slightly to the substrate surface.

Figure 4:
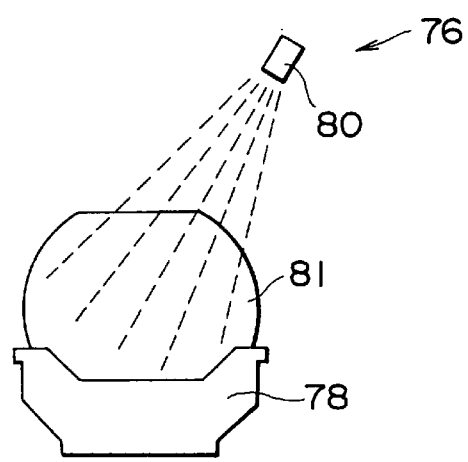
FIG. 4 is a typical perspective view showing an example of a cleaning apparatus.
Figure 5:
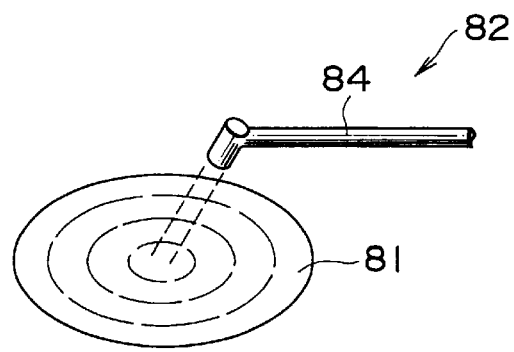
FIG. 5 is a typical perspective view showing another example of a cleaning apparatus.

Therefore, in the embodiment 2, apparatus such as shown in FIG. 4 and FIG. 5 are used, processing same as the resist peeling-off and cleaning process which has been performed in the embodiment 1 was performed for a short period, and furthermore, the substrate was cleaned with acetone or isopropyl alcohol (a residue cleaning process). As a result, the quantity of the photoresist film and adhesives on the substrate surface has been reduced further by a large margin.

FIG. 4 and FIG. 5 are typical perspective views showing an example of a cleaning apparatus, respectively.

A cleaning apparatus 76 shown in FIG. 4 is composed of a carrier 78 for housing the substrate and a spray portion 80. When cleaning is performed, a substrate 81 completed with the residue removing process is housed in the carrier, and is cleaned while applying impact force of a solution to the residues by jetting a temperature-controlled resist peeling-off liquid and further an organic solvent with a spray from the spray portion 80 and blowing it against the substrate while rotating the substrate in one body with the carrier. The pressure of the solution before spraying is 7 kg/cm$^2$ in either case.

A cleaning apparatus 82 shown in FIG. 5 is composed of a spin coater (not shown) for fixing the substrate piece after piece and a jet nozzle 84. When cleaning is performed, the substrate 81 is fixed to the spin coater, and then a temperature controlled resist peeling-off liquid, and further an organic solvent are jetted from the jet nozzle 84 and blown against the substrate 81 while rotating the substrate in one body with the carrier, thereby to clean the substrate 81 while adding a centrifugal force to the solution from the substrate 81. The pressure of the solution before spraying in 70 kg/cm² in either case.

When the cleaning apparatus 76 or the cleaning apparatus 82 is used, it is possible to apply physical force to the residues thereby to remove the residues. Moreover, since the temperature of the solvent has been controlled, the residues can be dissolved easily.

After the cleaning process is completed, solder ball bumps have been formed similarly to the embodiment 1.

It has been confirmed that, in a product in which a semiconductor device on which solder bumps have been formed by the method of the embodiment 2 is packaged with flip chip bonding, the reliability and the durability are improved further by a large margin than the embodiment 1. Further, the product yield in the case of flip chip bonding was high.

According to the method of the present invention, it is possible to form an electrode extension portion having a predetermined configuration and solder bumps and to prevent poor flip chip bonding by forming an electrode extension portion having a connecting portion for connecting with an electrode pad at one end, a solder bump foundation portion at another end, and a wiring portion for connecting the connecting portion and the solder bump foundation portion with each other and composed of barrier metal, and then by removing residues on the substrate with an adhesive tape when solder bumps are formed in the solder bump foundation portion. Accordingly, a product in which a semiconductor device on which solder bumps are formed by the method of the present invention is packaged has high reliability.

What is claimed is:

1. A method of forming a solder bump, comprising the steps of:
    forming a resist film on a substrate on which an electrode pad and a surface protective film have been formed successively, patterning the resist film and opening a connecting hole in a predetermined pattern;
    forming a barrier metal layer on the substrate where the connecting hole was opened, and removing the barrier metal layer on the resist film and forming an electrode extension portion comprised of the barrier metal layer in the connecting hole; and
    removing residue by applying an adhesive tape on a substrate surface, and peeling the adhesive tape off the substrate surface together with the residue.

2. A method of forming a solder bump according to claim 1, further comprising a step of sputter-etching (reverse sputtering) the resist film an forming a portion of the resist film into an overhang shape in which a bore of an opening edge of the connecting hole is reduced as compared with a bottom portion of the connecting hole.

3. A method of forming a solder bump according to claim 1, further comprising a step of applying the adhesive tape by advancing a roller wound with the adhesive tape across the substrate, and removing the adhesive tape by rotating another roller.

4. A method of forming a solder bump according to claim 2 further comprising a step of applying the adhesive tape by advancing a roller wound with the adhesive tape across the substrate, and removing the adhesive tape by rotating another roller.

5. A method of forming a solder bump according to claim 1, further comprising a step of cleaning a substrate surface with organic solvent after the step of removing the residue.

6. A method of forming a solder bump according to claim 2, further comprising a step of cleaning a substrate surface with organic solvent after the step of removing the residue.

7. A method of forming a solder bump according to claim 3, further comprising a step of cleaning a substrate surface with organic solvent after the step of removing the residue.

8. A method of manufacturing a semiconductor device comprising the steps of:
    forming a resist film on a substrate on which an electrode pad and a surface protective film have been formed successively and patterning the resist film by photolithography to open a connecting hole in a predetermined pattern;
    forming a barrier metal layer on the substrate where the connecting hole was opened, and removing the barrier metal layer on the resist film and forming an electrode extension portion comprised of the barrier metal layer in the connecting hole; and
    applying an adhesive tape on a substrate surface and removing the adhesive tape together residues.

9. A method of manufacturing a semiconductor device according to claim 8, further comprising a step of applying sputter-etching (reverse sputtering) to the resist film and forming a portion of the resist film into an overhang shape in which a bore of an opening edge of the connecting hole is reduced as compared with a bottom portion of the connecting hole.

10. A method of manufacturing a semiconductor device according to claim 8, further comprising a step of applying the adhesive tape by advancing a roller wound with the adhesive tape across the substrate, and removing the adhesive tape by rotating another roller.

11. A method of manufacturing a semiconductor device according to claim 9, further comprising a step of applying the adhesive tape by advancing a roller wound with the adhesive tape across the substrate, and removing the adhesive tape by rotating another roller.

12. A method of manufacturing a semiconductor device according to claim 8, further comprising a step of cleaning a substrate surface with organic solvent after removing the residue.

13. A method of manufacturing a semiconductor device according to a claim 9, further comprising a step of cleaning a substrate surface with organic solvent after removing the residue.

14. A method of manufacturing a semiconductor device according to claim 10, further comprising a step of cleaning a substrate surface with organic solvent after removing the residue.

15. A method of forming a solder bump comprising the steps of:
    forming an electrode pad on a substrate;
    coating the substrate and electrode pad with a protective layer;
    opening the protection layer above the electrode pad;
    forming a barrier metal layer on the electrode pad;
    forming a ball-shaped, solder member on the barrier metal; and removing residue by applying an adhesive tape on a substrate surface and peeling the adhesive tape off the substrate surface together with the residue.

16. A method of forming a solder bump according to claim 15, further comprising a step of sputter-etching (reverse sputtering) the resist film an forming a portion of the resist film into an overhang shape in which a bore of an opening edge of the connecting hole is reduced as compared with a bottom portion of the connecting hole.

17. A method of forming a solder bump according to claim 15, further comprising a step of applying the adhesive tape by advancing a roller wound with the adhesive tape across the substrate, and removing the adhesive tape by rotating another roller.

18. A method of forming a solder bump according to claim 17 further comprising a step of applying the adhesive tape by advancing a roller wound with the adhesive tape across the substrate, and removing the adhesive tape by rotating another roller.

19. A method of forming a solder bump according to claim 1, further comprising a step of cleaning a substrate surface with organic solvent after the step of removing the residue.

20. A method of forming a solder bump according to claim 2, further comprising a step of cleaning a substrate surface with organic solvent after the step of removing the residue.

* * * * *